United States Patent
Yim et al.

(10) Patent No.: US 9,245,809 B2
(45) Date of Patent: Jan. 26, 2016

(54) PIN HOLE EVALUATION METHOD OF DIELECTRIC FILMS FOR METAL OXIDE SEMICONDUCTOR TFT

(71) Applicant: Applied Materials, Inc., Santa Clara, CA (US)

(72) Inventors: Dong-Kil Yim, Santa Maria, CA (US); Tae Kyung Won, San Jose, CA (US); Seon-Mee Cho, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/199,318

(22) Filed: Mar. 6, 2014

(65) Prior Publication Data

US 2014/0273312 A1 Sep. 18, 2014

Related U.S. Application Data

(60) Provisional application No. 61/778,223, filed on Mar. 12, 2013.

(51) Int. Cl.
*H01L 21/66* (2006.01)

(52) U.S. Cl.
CPC ............ *H01L 22/12* (2013.01); *H01L 22/24* (2013.01)

(58) Field of Classification Search
CPC .................................................. H01L 22/24
See application file for complete search history.

(56) References Cited

U.S. PATENT DOCUMENTS

| | | | |
|---|---|---|---|
| 4,599,241 A * | 7/1986 | Nakaboh et al. | 438/16 |
| 6,225,137 B1 * | 5/2001 | Lin | 438/14 |
| 6,949,481 B1 | 9/2005 | Halliyal et al. | |
| 2009/0184315 A1 | 7/2009 | Lee et al. | |
| 2011/0306169 A1 | 12/2011 | Ye | |
| 2012/0045904 A1 | 2/2012 | Choi | |
| 2012/0171391 A1 | 7/2012 | Won et al. | |

FOREIGN PATENT DOCUMENTS

JP 8-31898 A * 2/1996 ............ H01L 21/66

OTHER PUBLICATIONS

Iternational Search Report and Written Opinion for International Application No. PCT/US2014/014951 (APPM 20521PC) dated May 19, 2014.

\* cited by examiner

*Primary Examiner* — Stephen W Smoot
(74) *Attorney, Agent, or Firm* — Patterson & Sheridan, LLP

(57) ABSTRACT

The present invention generally relates to methods measuring pinhole determination. In one aspect, a method of measuring pinholes in a stack, such as a TFT stack, is provided. The method can include forming an active layer on a deposition surface of a substrate, forming a dielectric layer over the active layer, delivering an etchant to at least the dielectric layer, to etch both the dielectric layer and any pinholes formed therein and optically measuring the pinhole density of the etched dielectric layer using the active layer.

13 Claims, 5 Drawing Sheets

PIN HOLE EVALUATION METHOD OF DIELECTRIC FILMS FOR METAL OXIDE SEMICONDUCTOR TFT

CROSS-REFERENCE TO RELATED APPLICATIONS

This application claims benefit of U.S. Provisional Patent Application Ser. No. 61/778,223, filed Mar. 12, 2013, which is herein incorporated by reference.

BACKGROUND

1. Field

Embodiments generally relate to a method to evaluate the pinholes of a dielectric film in a thin film transistor (TFT) structure.

2. Description of the Related Art

In recent years there has been growing interest in thin film transistors (TFTs) and devices incorporating such TFTs, such as flat panel displays, all types of integrated circuits and replacements for mechanical switches and relays. Many TFTs, such as metal oxide semiconductor TFTs, are very sensitive to hydrogen, oxygen and water in terms of device stability and repeatability.

Metal oxide semiconductor TFTs are very sensitive to hydrogen and water in terms of device stability and repeatability. The active layer (i.e., the metal oxide semiconductor layer) should be protected by an etch stop layer (e.g., for ES or etch stop-TFTs), and a passivation layer for back channel etch TFT (e.g., BCE TFT) during and/or after the TFT fabrication process. It is believed that pinholes of the dielectric layer are a major path for $H_2$ and/or water penetration. Pinholes in the dielectric layer are believed to allow water and $H_2$ to penetrate through the etch stop layer and/or the passivation layer toward the active layer (i.e., the metal oxide semiconductor).

In order to detect pinhole formation in a passivation layer, scanning electron microscope (SEM) studies have been performed at points after HF etching of the dielectric layer. SEM studies use a focused beam of high-energy electrons to generate a variety of signals to produce a high magnification image of the surface of a substance, such as a passivation layer. However, SEM studies have drawbacks that are not easily overcome. First, it is difficult for an SEM to look at wide range of films since SEM is generally applied for high magnification. Second, SEM cannot differentiate between a pinhole in a film and a sponge like porous film after etching.

Thus, there is a need for improved methods of determining pinhole formation.

SUMMARY

The embodiments described herein generally relate to a method of evaluating the pinholes of a dielectric film in a TFT. In one embodiment, a method of analyzing a device can include forming an active layer on a deposition surface of a substrate; forming a dielectric layer over the active layer; etching at least the dielectric layer to remove at least 40 percent of the dielectric layer creating an etched dielectric layer; and optically measuring a pinhole density of the etched dielectric layer using the active layer.

In another embodiment, a method of detecting pinholes can include positioning a substrate in a processing chamber; delivering a halogen-containing etchant to the dielectric layer to etch the thickness of the dielectric layer to be approximately equal to the thickness of the active layer, wherein portions of the active layer are exposed by the halogen containing etchant; etching the exposed portions of the active layer creating one or more void regions; and examining the substrate for void regions in the active layer, each of the void regions corresponding to a pinhole in the dielectric layer. The substrate can include an active layer; and a dielectric layer having a thickness.

In another embodiment, a method of analyzing a device can include positioning a substrate in a processing chamber, the substrate having a deposition surface; forming an IGZO active layer on the deposition surface, the IGZO layer deposited to a first thickness; forming a silicon oxide layer over the IGZO active layer to a second thickness; delivering an etchant comprising HF to the silicon oxide layer, the etchant removing approximately 50% of the second thickness of the silicon oxide layer, wherein portions of the IGZO active layer are exposed to the etchant; etching the exposed portions of the IGZO active layer creating one or more void regions; and examine the substrate for void regions formed by the etchant in the IGZO active layer, each of the void regions corresponding to a pinhole in the silicon oxide layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention, and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein generally relate to methods of evaluating the pinholes of a dielectric film in a TFT. Pinhole-free $SiO_x$ layers are key to metal oxide TFT integrity and should be evaluated. We propose wet etching/optical microstructural inspection with a novel IGZO/$SiO_x$ dual-layer structure.

By using the embodiments described herein, pinholes in the dielectric layer can be made visibly detectable due to preferential etching of the active layer. Pinholes of dielectric layers become a clear shape and larger after wet etching. Since the pinhole area of film is porous and not dense compared with other no pinhole areas of the dielectric film. Wet etching, such as a hydrofluoric acid (HF) etch, can effectively etch most dielectric films, such as $SiO_x$ films. With enough time or enough surface area removal of wet etching, the porous area will be etched both at the deposited layer thickness and at the sidewalls of the pinholes, while etching at other no pinhole areas will progress uniformly in the thickness direction alone. The additional etching of the pinholes of the porous area of dielectric film can allow the HF to reach the active layer, such as the metal oxide layer. The active layer is generally more susceptible to HF and other acids than the dielectric layer is. As such, the active layer is etched much faster by HF. The resulting void regions in the active layer are a much wider area than the actual pinhole size of dielectric film after HF wet etching. The etched void regions are easily seen using a standard optical devices, such as a light microscope, thus making the determination of defective devices more practical than through current SEM methods. The embodiments described herein with relation to the inventions can be more clearly understood with reference to the figures below.

Figure 1:
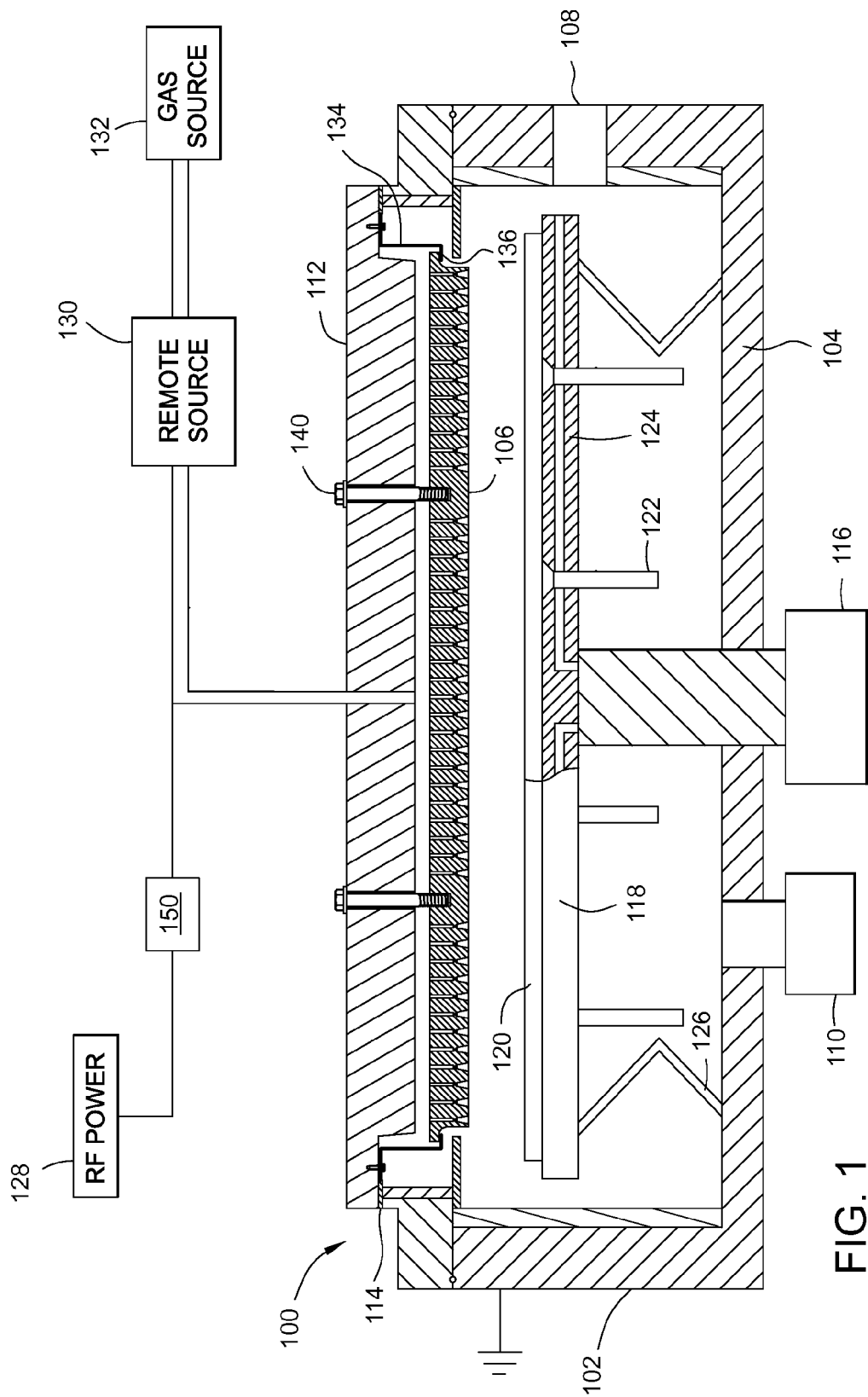
FIG. 1 depicts a cross-sectional view of a schematic process chamber, according to one embodiment.

FIG. 1 is a schematic, cross sectional view of a process chamber that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 can also include RF return straps 126 to provide an RF return path at the periphery of the substrate support 118.

The showerhead 106 can be coupled to a backing plate 112 by a fastening mechanism 140. The showerhead 106 may be coupled to the backing plate 112 by one or more fastening mechanisms 140 to help prevent sag and/or control the straightness/curvature of the showerhead 106.

A gas source 132 can be coupled to the backing plate 112 to provide process gases through gas passages in the showerhead 106 to a processing area between the showerhead 106 and the substrate 120. The gas source 132 can include a silicon-containing gas supply source, an oxygen containing gas supply source, and a carbon-containing gas supply source, among others. Typical process gases useable with one or more embodiments include silane ($SiH_4$), disilane, $N_2O$, ammonia ($NH_3$), $H_2$, $N_2$ or combinations thereof.

A vacuum pump 110 is coupled to the chamber 100 to control the process volume at a desired pressure. An RF source 128 can be coupled through a match network 150 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2:
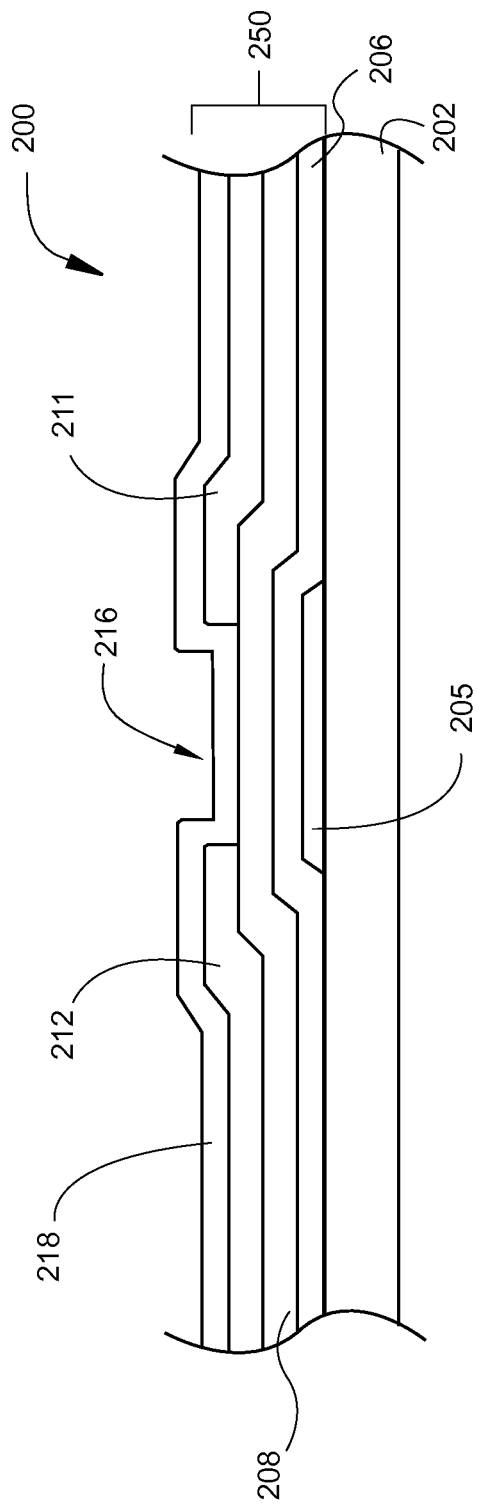
FIG. 2 is a schematic illustration of a TFT device, according to one embodiment.

FIG. 2 is a schematic illustration of a TFT device 200 according to one embodiment. The TFT device 200 includes a substrate 202 and an MO-TFT stack 250. The MO-TFT stack 250 can include a gate electrode 205, a gate dielectric layer 206, an active layer 208, a source electrode 211, a drain electrode 212 and a dielectric layer 218.

As shown in FIG. 2, the MO-TFT stack 250 includes the gate electrode 205 deposited on the surface of the substrate 202. Suitable materials that may be utilized for the substrate 202 include but are not limited to glass, plastic, and semiconductor wafers. Suitable materials that may be utilized for the gate electrode 205 include but are not limited to chromium, molybdenum, copper, aluminum, tungsten, titanium, and combinations thereof.

The gate dielectric layer 206 is then deposited over both the substrate 202 and the gate electrode 205. The gate dielectric layer 206 can include SiOF, SiN, $SiO_x$, silicon oxynitride (SiON) and combinations thereof. Additionally, while shown as a single layer, it is contemplated that the gate dielectric layer 206 may comprise multiple layers, each of which may comprise a different chemical composition. The gate dielectric layer 206 should be deposited with minimal hydrogen.

The active layer 208 is deposited as the semiconductor layer of the MO-TFT stack 250. Suitable materials that may be used for the active layer 208 include IGZO, zinc oxynitride and zinc oxide. The active layer 208 may be deposited by suitable deposition methods such as PVD. In one embodiment, the PVD may comprise applying a DC bias to a rotary cathode.

The source electrode 211 and the drain electrode 212 may be formed over the active layer 208. In forming the source electrode 211 and the drain electrode 212, a portion of the active layer 208 is exposed between the source electrode 211 and drain electrode 212. This area between the source electrode 211 and drain electrode 212 is referred to as the active channel 216. In another embodiment, an etch stop (not shown) may be formed in the active channel 216 as well as under a portion of the source electrode 211 and the drain electrode 212.

The dielectric layer 218 is then deposited over the active channel 216, the source electrode 211 and drain electrode 212. In one embodiment, the dielectric layer 218 that is in contact with the active channel 216 of the active layer 208 or the etch stop is a low hydrogen containing oxide, such as $SiO_x$ or SiOF. The dielectric layer 218 can be deposited to a thickness of from 300 Å to 3000 Å. As depicted, the deposition of the dielectric layer 218 is substantially conformal across the surface of the active channel 216, the source electrode 211 and drain electrode 212.

Pinholes formed in the one or more barrier layers, such as the dielectric layer 218, allow atmospheric gases such as hydrogen to reach the active layer 208. There are a number of atmospheric gases which are known or believed to affect TFT performance. Adsorption of $H_2O$ at the active layer can lead to accumulation of electron carriers in the active layer. Adsorption of $O_2$ can result in depletion of electron carriers in the active layer. Hydrogen diffusion into the active layer can make it conductive. As the active layer quality is a function of carrier density and defect density, the gate dielectric layer/active layer interface, the active layer/etch stop interface and the active channel/passivation layer interface should have minimal contact with atmospheric hydrogen, oxygen and water.

Figure 3:
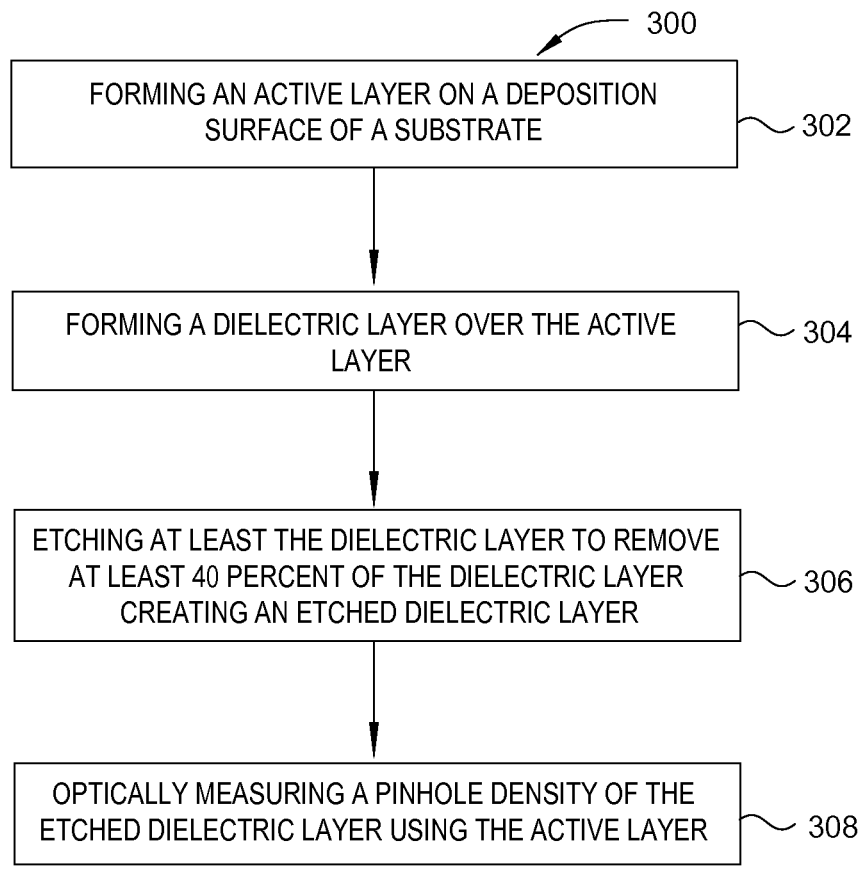
FIG. 3 depicts a block diagram of a method for detecting pinholes, according to one embodiment.
Figure 4A:
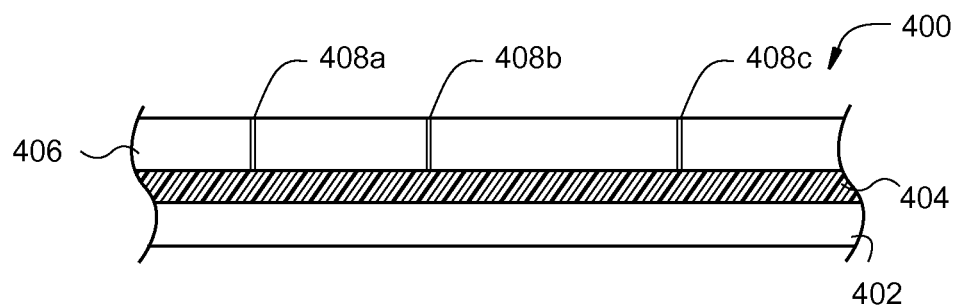
FIGS. 4A-4C are schematic illustrations of a substrate processed using the pinhole determination method, according to one embodiment.
Figure 4B:
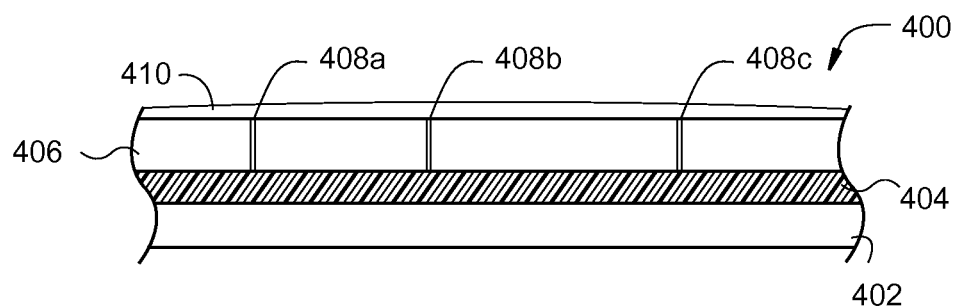
Figure 4C:
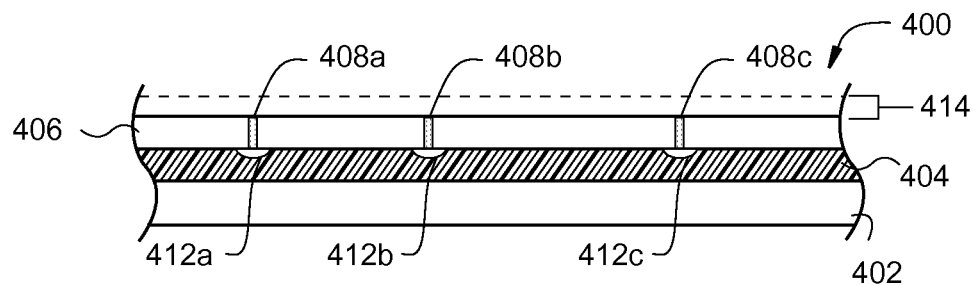

FIG. 3 depicts a block diagram of a method 300 for detecting pinholes according to one embodiment. The method 300 includes forming an active layer on a deposition surface of a substrate, at 302; forming a dielectric layer over the active layer, at 304; delivering an etchant to at least the dielectric layer, the dielectric layer being etched by the etchant to remove at least 40 percent of the dielectric layer, at 306; and optically measuring the pinhole density FIGS. 4A-4C are schematic illustrations of the pinhole determination method as described with reference to FIG. 3.

The method 300 begins by forming an active layer 404 on a deposition surface of a substrate 402, at element 302. Suitable materials that may be used for the active layer 404 include IGZO, zinc oxynitride and zinc oxide. The active layer 404 may be deposited by suitable deposition methods such as PVD. In one embodiment, the PVD may comprise applying a DC bias to a rotary cathode.

Once the active layer 404 is deposited, a dielectric layer 406 can then be formed over the active layer 404, at element 304. The dielectric layer 406 is formed over the surface of the active layer 404. The dielectric layer 406 can be deposited to a thickness of from 50 Å to 3000 Å, such as from 100 Å to 1000 Å. Though the dielectric layer 406 is described as a single layer, further embodiments of the dielectric layer 406 can include more than one layer and the layers may be of different chemical composition than any previous layer. The dielectric layer 406 can include $SiO_2$, $Al_2O_3$, silicon nitrides, hafnium oxides ($HfO_x$), titanium oxides ($TiO_x$), tantalum oxides ($TaO_x$), zirconium oxides ($ZrO_x$) or combinations thereof.

When $SiO_2$ is used as the dielectric layer 406, the $SiO_2$ can be deposited either by MW-PECVD, PECVD or PVD. The plasma damage associated with PVD and the hydrogen incorporating from PECVD can be reduced or avoided using MW-PECVD. In one embodiment, MW-PECVD is used to deposit a $SiO_2$ dielectric layer. MW-PECVD deposition provides highly conformal deposition results, less plasma damage to the deposited films and reduction of hydrogen concentration in the deposited layer. MW-PECVD silicon oxide is normally deposited with $SiH_4+O_2$ or $SiH_4+N_2O$ as the source gases, where the former provides better film quality than the latter.

The dielectric layer 406 can have a plurality of pinholes, depicted here as three pinholes 408a-408c. The pinholes 408a-408c are shown as generally being cylinders having an equal diameter and extending through the thickness of the dielectric layer 406. However, the pinholes 408a-408c may be of a variety of shapes, lengths and sizes. The pinholes 408a-408c provide a pathway for atmospheric gases to reach the active layer 404, leading to device failure as described above.

With the dielectric layer 406 deposited, an etchant 410 is delivered to at least the dielectric layer 406, at element 306. Shown in FIG. 4B, is the etchant 410 on the surface of the dielectric layer 406. The etchant 410 can be a halogen-containing etchant, such as HF. The concentration of the HF can be between 1:25 and 1:200, such as a 1:100 HF solution. The etching properties of the etchant are a function of factors such as exposure time and concentration of the etchant. The dielectric layer 406 can have a thickness which is comparatively larger than the thickness of the active layer 404. In one embodiment, the dielectric layer 406 is two-fold the thickness of the active layer 404.

The etchant 410 can etch a portion of the thickness of the dielectric layer 406. In one embodiment, the dielectric layer 406 is etched to a thickness approximately equal to that of the active layer 404. In another embodiment, the dielectric layer 406 is etched to between 40% and 60% of the original thickness, such as approximately 50% of the original thickness. As shown in FIG. 3C, the etchant 410 has etched a portion of the thickness of the dielectric layer 406, depicted as an etched area 414. Further, the etchant 410 has etched the pinholes 408a-408c wider. The etchant 410 can then access the active layer 404. The etchant 410 has a much higher etch rate for the active layer 404 than it does for the dielectric layer 406. Therefore, the etchant 410 creates a plurality of void regions, depicted here as void regions 412a-412c.

Once the dielectric layer 406 has been etched by the etchant 410, the pinhole density of the dielectric layer 406 can be optically measured using the etched active layer, at element 308. The void regions 412a-412c correspond to the pinholes 408a-408c. However, the void regions 412a-412c are comparatively larger and visible using an optical device, such as a light microscope.

The pinholes 408a-408c are not large enough, either before or after etching, to be seen without a high magnification device, such as a SEM. Using differential etching between the dielectric layer 406 and the active layer 404, the active layer 404 can be used to provide an indication of the location of the pinholes 408a-408c. Here, the dielectric layer 406 is etched such that the pinholes 408a-408c open to expose the underlying portions of the active layer 404. The exposed portions of the active layer 404 are etched to create more visible void regions 412a-412c. The void regions 412a-412c can be seen using light-based devices, such as an optical microscope.

Figure 5:
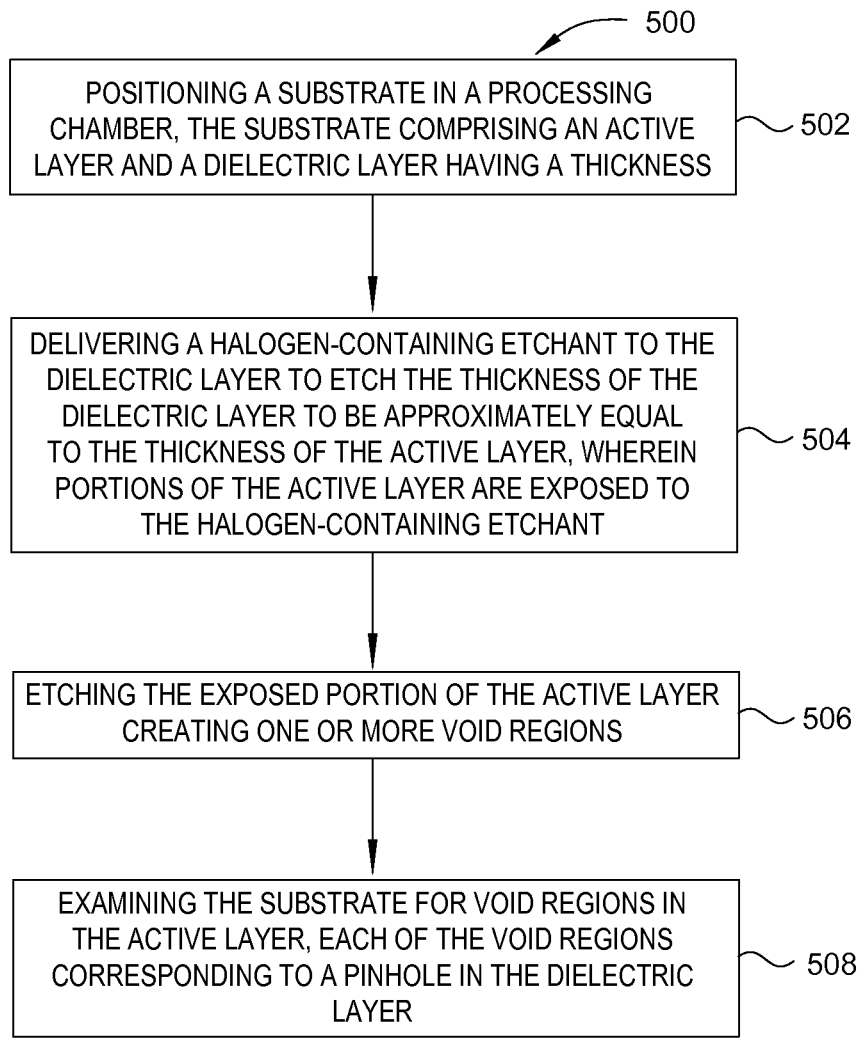
FIG. 5 depicts a method of processing a substrate, according to one embodiment.

FIG. 5 depicts a method 500 of processing a substrate, according to embodiments described herein. The method 500 includes positioning a substrate in a processing chamber; the substrate comprising a deposition surface, an active layer and a dielectric layer having a length, width and thickness, at 502; delivering a halogen-containing etchant to the dielectric layer to etch the thickness of the dielectric layer to be approximately equal to the thickness of the active layer, wherein portions of the active layer are exposed by the halogen containing etchant, at 504; etching the exposed active layer creating one or more void regions, at 506; and examining the substrate for void regions in the active layer, each of the void regions corresponding to a pinhole, at 508.

The method 500 begins by positioning a substrate in a processing chamber, at element 502. The substrate can be a substrate as described with reference to FIG. 2. The substrate has a deposition surface, an active layer and a dielectric layer. The active layer can comprise a material as described above with reference to FIGS. 2 and 3. In one embodiment, the active layer is between 100 Å and 2000 Å thick, such as 1000 Å.

The dielectric layer is disposed over the active layer. The dielectric layer can be a silicon oxide layer, such as $SiO_2$. The dielectric layer has a length, width and thickness. The length and the width generally describe the two dimensional coverage of the dielectric layer, where the length and width directions correspond to the length and width directions of the active layer and the deposition surface of the substrate. The thickness of the dielectric layer can be between 200 Å and 4000 Å, such as 2000 Å.

Once the substrate is positioned in the processing chamber, a halogen-containing etchant can be delivered to the dielectric layer, at element 504. The halogen-containing etchant can be HF, as described with reference to FIG. 3. The halogen-containing etchant can etch the thickness of the dielectric layer to be approximately equal to the thickness of the active layer. In one embodiment, the dielectric layer is deposited to a thickness of 2000 Å over an active layer of approximately 1000 Å. The dielectric layer is then etched from 2000 Å to 1000 Å.

Following the etching of the dielectric layer, an exposed portion of the active layer can be etched creating one or more void regions, at element 506. The etching of the dielectric layer can open up preexisting pinholes, which can then expose portions of the active layer to the halogen-containing etchant. As the pinholes open due to lateral etching, more of the active layer will be exposed under the pinhole. The halogen-containing etchant will preferentially etch the active layer over the dielectric layer, one or more void regions will be formed in the active layer under the pinhole sites. The size of the void region will reflect the amount of etch time as well as the concentration of the etchant available to the active layer at that site.

Once the void regions are formed, the substrate can be examined for void regions in the active layer, at element 508. Each of the void regions are expected to correspond to an opening in the dielectric layer, such as a pinhole. As such, the larger size of the void region allows the quantity of the pinholes to be measured by an optical device, such as a camera or a light microscope. The size and morphology of the void regions can provide further information such as the size of the pinhole and the proximity of other pinholes in the dielectric layer.

The embodiments described herein discloses methods of determining the number of pinholes formed in a dielectric layer without the use of high magnification, such as from a scanning electron microscope. A stack is formed with at least an active layer and a dielectric layer. The stack can include other layers, such as in a TFT. The dielectric layer is formed with enough thickness such that the dielectric layer can be etched to between approximately 40% and approximately 60% the original thickness. The dielectric layer is then etched as described using an etchant which will preferentially etch the active layer over the dielectric layer, creating one or more void regions. The void regions can be seen using a standard light microscope or other optical devices.

Pin-hole-free dielectric layers, such as $SiO_x$ layers, are beneficial to metal oxide TFT integrity and should be evaluated. By using the above described methods, substrates with poorly formed layers can be excluded by a simple and inexpensive process prior to undergoing further processing.

While the foregoing is directed to embodiments of the present invention, other and further embodiments of the invention may be devised without departing from the basic scope thereof, and the scope thereof is determined by the claims that follow.

The invention claimed is:

1. A method of analyzing a device, comprising:
   forming an active layer on a deposition surface of a substrate;
   forming a dielectric layer over the active layer;
   etching at least the dielectric layer to remove at least 40 percent of the dielectric layer creating an etched dielectric layer, wherein the etchant etches the active layer faster than the dielectric layer; and
   optically measuring a pinhole density of the etched dielectric layer using the active layer.

2. A method of analyzing a device, comprising:
   forming an active layer on a deposition surface of a substrate, wherein the active layer comprises IGZO;
   forming a dielectric layer over the active layer;
   etching at least the dielectric layer to remove at least 40 percent of the dielectric layer creating an etched dielectric layer; and
   optically measuring a pinhole density of the etched dielectric layer using the active layer.

3. A method of detecting pinholes, sequentially comprising:
   positioning a substrate in a processing chamber, the substrate comprising:
      an active layer; and
      a dielectric layer having a thickness;
   delivering a halogen-containing etchant to the dielectric layer to etch the thickness of the dielectric layer to be approximately equal to the thickness of the active layer, wherein portions of the active layer are exposed by the halogen containing etchant;
   etching the exposed portions of the active layer creating one or more void regions; and
   examining the substrate for void regions in the active layer, each of the void regions corresponding to a pinhole in the dielectric layer.

4. The method of claim 3, wherein the dielectric layer as formed has approximately twice the thickness of the active layer.

5. The method of claim 3, wherein the halogen-containing etchant is a hydrofluoric acid.

6. The method of claim 3, wherein the etchant etches the active layer faster than the dielectric layer.

7. The method of claim 3, wherein the examining is an optical measurement.

8. The method of claim 3, wherein the dielectric layer comprises $SiO_2$, $Al_2O_3$, silicon nitrides, hafnium oxides ($HfO_x$), titanium oxides ($TiO_x$), tantalum oxides ($TaO_x$), zirconium oxides ($ZrO_x$) or combinations thereof.

9. The method of claim 3, wherein the active layer comprises IGZO.

10. A method of analyzing a device, comprising:
    positioning a substrate in a processing chamber, the substrate having a deposition surface;
    forming an IGZO active layer on the deposition surface, the IGZO layer deposited to a first thickness;
    forming a silicon oxide layer over the IGZO active layer to a second thickness;
    delivering an etchant comprising HF to the silicon oxide layer, the etchant removing approximately 50% of the second thickness of the silicon oxide layer, wherein portions of the IGZO active layer are exposed to the etchant;
    etching the exposed portions of the IGZO active layer creating one or more void regions; and
    examine the substrate for void regions formed by the etchant in the IGZO active layer, each of the void regions corresponding to a pinhole in the silicon oxide layer.

11. The method of claim 10, wherein the first thickness is between about 500 Å and 2000 Å thick.

12. The method of claim 10, wherein the silicon oxide layer as formed is between 1000 Å and 4000 Å thick.

13. The method of claim 10, wherein the void regions are visible using optical microscopy.

* * * * *